(12) United States Patent
Raghunathan et al.

(10) Patent No.: US 11,428,882 B2
(45) Date of Patent: Aug. 30, 2022

(54) INTERPOSER

(71) Applicant: ROCKLEY PHOTONICS LIMITED, Oxford (GB)

(72) Inventors: Vivek Raghunathan, Mountain View, CA (US); Aaron John Zilkie, Pasadena, CA (US)

(73) Assignee: Rockley Photonics Limited, Altrincham (GB)

( * ) Notice: Subject to any disclaimer, the term of this patent is extended or adjusted under 35 U.S.C. 154(b) by 0 days.

(21) Appl. No.: 16/899,264

(22) Filed: Jun. 11, 2020

(65) Prior Publication Data
US 2020/0400902 A1 Dec. 24, 2020

(30) Foreign Application Priority Data

Jun. 11, 2019 (GB) ..................................... 1908308

(51) Int. Cl.
*G02B 6/42* (2006.01)

(52) U.S. Cl.
CPC ......... *G02B 6/4274* (2013.01); *G02B 6/4243* (2013.01); *G02B 6/4245* (2013.01)

(58) Field of Classification Search
CPC ... G02B 6/4274; G02B 6/4243; G02B 6/4245
USPC ........................................................ 385/14
See application file for complete search history.

(56) References Cited

U.S. PATENT DOCUMENTS

| 9,472,710 B1* | 10/2016 | Gates ..................... G02B 6/305 |
| 9,746,743 B1* | 8/2017 | Rabiei ................... G02F 1/2255 |
| 10,338,325 B1* | 7/2019 | Janta-Polczynski ........................ G02B 6/4206 |
| 2014/0042463 A1 | 2/2014 | Uemura et al. |
| 2014/0044389 A1 | 2/2014 | Uemura et al. |
| 2014/0355931 A1* | 12/2014 | Tummala ................. G02B 6/43 385/14 |
| 2015/0381273 A1 | 12/2015 | Gloeckner et al. |
| 2016/0036550 A1 | 2/2016 | Welch |
| 2017/0237516 A1 | 8/2017 | Welch |
| 2018/0128998 A1* | 5/2018 | Furuyama ............ G02B 6/4239 |

(Continued)

FOREIGN PATENT DOCUMENTS

| EP | 2 639 978 A1 | 9/2013 |
| EP | 2 696 229 A2 | 2/2014 |

(Continued)

OTHER PUBLICATIONS

U.K. Intellectual Property Office Search and Examination Report, dated Dec. 2, 2019, for Patent Application No. GB1908308.8, 7 pages.

(Continued)

*Primary Examiner* — Jerry M Blevins
(74) *Attorney, Agent, or Firm* — Lewis Roca Rothgerber Christie LLP

(57) ABSTRACT

A silicon interposer. The silicon interposer including: a silicon layer, including one or more optical waveguides each connectable to an optical fiber; an optically active component, configured to convert optical signals received from the optical fiber into electrical signals or to convert electrical signals into optical signals and provide them to the optical fiber; and one or more electrical interconnects, connected to the optically active component and connectable to a printed circuit board, a separate die, a separate substrate, or a wafer level package.

23 Claims, 4 Drawing Sheets

(56) References Cited

U.S. PATENT DOCUMENTS

2018/0284372 A1* 10/2018 Badehi .................. G02B 6/423
2018/0314057 A1* 11/2018 Yasumura .............. G02B 6/352
2019/0074906 A1   3/2019 Peterson et al.
2019/0121025 A1   4/2019 Verslegers et al.
2019/0137706 A1*  5/2019 Xie ......................... G02B 6/43

FOREIGN PATENT DOCUMENTS

EP         2696229 A2 *  2/2014   ......... G02B 6/12004
WO    WO 2017/151416 A2    9/2017

OTHER PUBLICATIONS

International Search Report and Written Opinion of the International Searching Authority, dated Sep. 22, 2020, Corresponding to PCT/EP2020/066243, 16 pages.

* cited by examiner

INTERPOSER

The present application claims priority to United Kingdom Application No. 1908308.8, filed Jun. 11, 2019, the entire contents of which is incorporated herein by reference.

The present invention relates to an interposer, and particularly a silicon interposer usable with a photonic integrated circuit.

There are a growing number of technical applications that require close integration and co-packaging of photonic and electronic circuits. For example, switch application specific integrated circuits (ASIC), field programmable gate arrays (FPGA), network interface controllers (NIC), graphical processing units (GPU), and systems on a chip (SOC).

The need for co-packaging, i.e. including both photonic and electronic components within a single housing or enclosure, is driven by the desire for increased bandwidth, lower power requirements, higher density, lower latency, and lower cost. A reflow compatible, surface mountable photonic chip is the basic building block for such an architecture. For example the Rockley Photonics LightDriver system demonstrates a potential integration scheme.

In another example, a photonic die is provided with through silicon vias to make electrical connections to convention analog chips.

A key component in any co-packaging or integration schemes is the interposer. The interposer provides an electrical interface between one socket or die connection and another. A traditional interposer may be formed from silicon, and include one or more traces as well as soldering joints to allow circuits located on different die to communicate when co-packaged. A conventional interposer as used, say, in the electronic packaging industry, provides an electrical connection between die-to-die or die-to-substrate/package or die-to-printed circuit board.

Accordingly, in a first aspect, the embodiments of the invention provide a silicon interposer, including:
  a silicon layer, said silicon layer including one or more optical waveguides each connectable to an optical fiber;
  an optically active component, configured to convert optical signals received from the optical fiber into electrical signals or to convert electrical signals into optical signals and provide them to the optical fiber; and
  one or more electrical interconnects, connected to the optically active component and connectable to a printed circuit board, a separate die, a separate substrate, or a wafer level package.

Advantageously, such a silicon interposer is surface mountable on a relatively high density multi-chip substrate. Further, such a silicon interposer may be mass reflowed to a substrate (e.g. organic or glass) in a conventional flip chip ball grid array (fCBGA) architecture. Moreover, the silicon interposed can be flip chip bonded to a die or further silicon interposer in a 2.5D/3D packaging architecture.

The silicon interposer may have any one or, to the extent that they are compatible, any combination of the following optional features.

By optically active, in the term optically active component, it may be meant that the component actively (i.e. not passively) interacts with light passing therethrough. Optically active component and optoelectronic component may be considered synonyms. The optically active component may be a III-V semiconductor based optically active component. The optically active component may include a photodiode (e.g., a III-V photodiode or a germanium photodiode), configured to convert optical signals received from the optical fiber into electrical signals, which are provided to the one or more electrical interconnects. The optically active component may include a light source and a modulator, and may be configured to convert an electrical signal received from the electrical interconnect to an optical signal providable to the optical fiber. By III-V semiconductor based, it may be meant that the optically active component comprises a III-V semiconductor, for example one or more III-V semiconductor layers or regions.

The one or more electrical interconnects may include one or more solder bumps. The solder bumps may be supported by one or more under-bump metallization regions. The one or more electrical interconnects may include one or more pins in a pin grid array. For example, the pins may be copper pillars.

The interposer may include a metal redistribution layer, which forms a part of an electrical connection between the optically active component and the one or more electrical interconnects.

The interposer may include one or more passivation layers located between the optical waveguide(s) and the electrical interconnect(s).

An optical fiber may be attached to the or each optical waveguide. The attachment may be achieved using a reflow compatible joint. By reflow compatible, it may be meant that the joint is capable of surviving a reflow process used to connect the interposer to a printed circuit board. For example, the reflow compatible joint may be a solder joint or high temperature epoxy (i.e. an epoxy which is not compromised at reflow temperatures). The reflow temperature may be at least 250° C. and no more than 260° C. As an example, the epoxy may be the A539-DM epoxy available from Addison Clear Wave Coatings Inc., P065 silicone gel from Gelest Inc., or the Optimax (RTM) 8046-LV UV curable epoxy from NovaChem Ltd. The optical fiber may be secured to the or each optical waveguide using a cap, preferably made from glass.

The interposer may be provided as a double-silicon-on-insulator, DSOI, wafer, the or each optical waveguide may be formed in a silicon layer of the DSOI wafer. The optically active component may be provided on the same silicon layer of the DSOI wafer as the or each optical waveguide. Advantageously, the DSOI wafer provides large waveguides which increase the ease with which mode converters can be provided and with which the V-groove interfaces can be integrated. This can allow a single mode optical fiber attachment.

The optically active component may be provided in a cavity of a silicon layer of the DSOI. This can allow the resulting photonic integrated circuit (PIC) including the optically active component, and waveguide, to have a planar surface. Such a planar surface is amenable to further back-end bumping (i.e. further definition of solder in the form of bumps or balls at a wafer level) and packaging steps which help define the electrical interconnectors.

The interposer may include a mode converter, located between each optical fiber and the respective optical waveguide.

In a second aspect, embodiments of the invention provide a method of manufacturing a silicon interposer, including the steps of:
  providing a double-silicon-on-insulator wafer, DSOI, in which one or more optical waveguides are fabricated;
  forming an interface at the or each optical waveguide suitable for connection to an optical fiber;
  providing an optically active component, configured to convert optical signals received from the optical fiber into electrical signals or convert electrical signals into optical signals and provide them to the optical fiber; and providing one or more electrical interconnects connected to the optically active component and connectable to a printed circuit board, a separate die, or a separate substrate.

The method may have any one or, to the extent that they are compatible, any combination of the following optional features.

Forming the interface may include forming one or more V-groove interfaces for connection to the optical fiber.

Providing the optically active component may include providing a wafer including the optically active component, and bonding or transfer printing the optically active component onto the DSOI wafer. This step can result in a planar surface for subsequent back-end processing and bumping.

The method may include a step, between providing the optically active component and the one or more electrical interconnects, of providing a passivation layer.

The method may include a step, between providing the optically active component and the one or more electrical interconnects, of providing a metal redistribution layer which forms a part of an electrical connection between the optically active component and the one or more electrical interconnects. The method may include a step, after providing the metal redistribution layer, of providing a second passivation layer.

The method may include a step, after providing the optically active component, of defining one or more under-bump metallization regions, suitable for use with the one or more electrical interconnects.

The one or more electrical interconnects may be provided through a solder ball drop process or a copper pillar bumping process, or through solder printing. The step of providing one or more electrical interconnects may be performed after the step of defining one or more under-bump metallization regions.

The one or more electrical interconnects may be provided through attachment of one or more pins of a pin grid array to the silicon interposer.

The method may include a step of attaching an optical fiber to the interface, and securing it in place. Securing the optical fiber may be performed by providing a reflow compatible joint between a cap and the optical fiber.

BRIEF DESCRIPTION OF THE DRAWINGS

Embodiments of the invention will now be described by way of example with reference to the accompanying drawings in which.

DETAILED DESCRIPTION AND FURTHER OPTIONAL FEATURES

Figure 1:
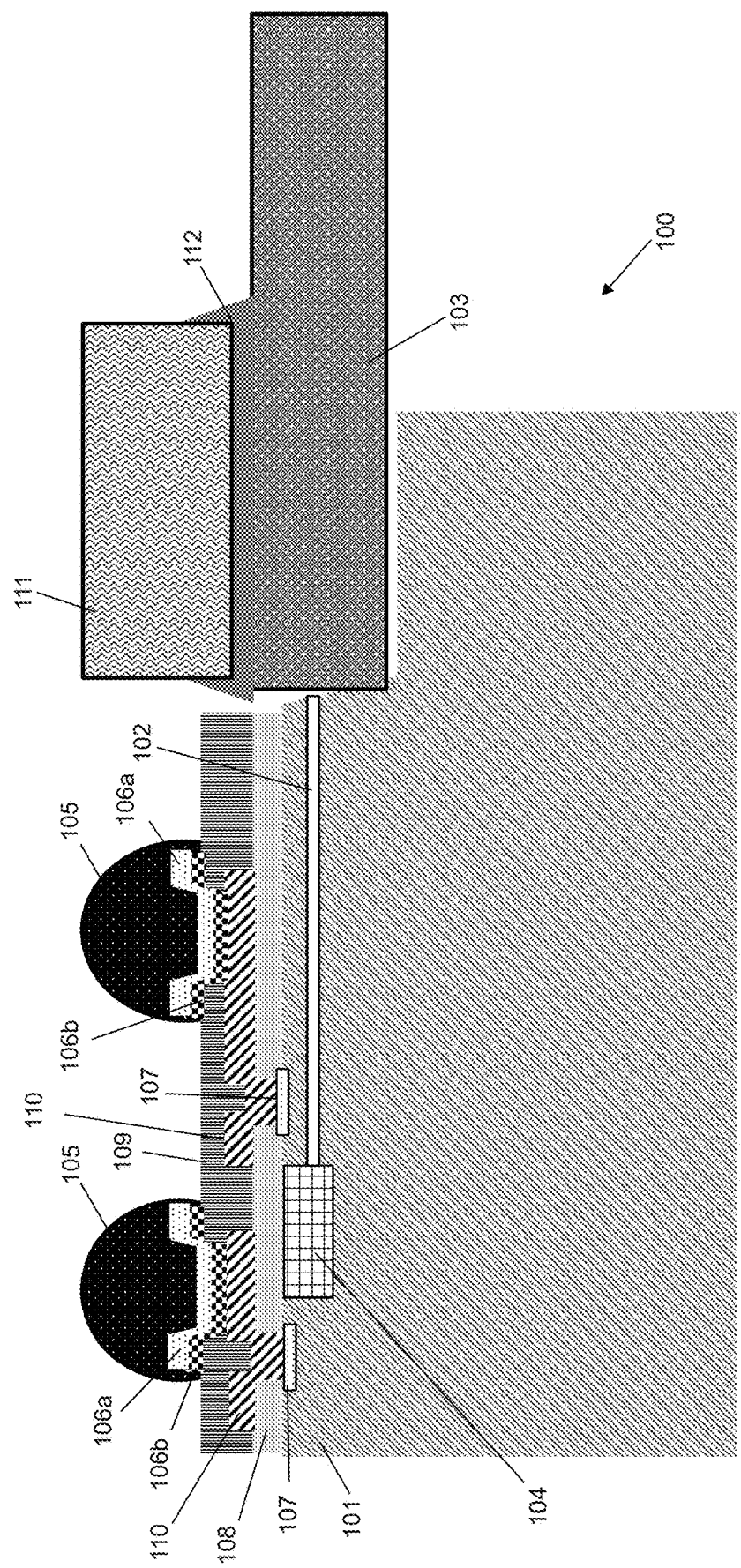
FIG. 1 shows a cross-sectional schematic view of a silicon interposer.

Aspects and embodiments of the present invention will now be discussed with reference to the accompanying figures. Further aspects and embodiments will be apparent to those skilled in the art. All documents mentioned in this text are incorporated herein by reference FIG. 1 shows a cross-sectional schematic view of a silicon interposer 100. The interposer is formed of a silicon layer 101 which is in this example is provided in a double-silicon-on-insulator wafer. The silicon layer contains an optical waveguide 102, which can convey light to and from an optical fiber 103 which is coupled to the optical waveguide. The waveguide may further convert an optical mode from an optical mode of the optical fibre 103 to an optical mode of an optically active component 104 coupled to the waveguide. In this example, the coupling is achieved through a V-groove interface etched in the silicon layer. At one end of the optical waveguide 102 is the optically active component 104, in this example a III-V semiconductor based photodiode. Therefore, in the example shown in FIG. 1, light is received from the optical fiber 103 and is converted into an electrical signal by the photodiode 104. In some embodiments the optically active component 104 is instead a germanium photodiode.

In an alternative example the optically active component includes an electro-absorption modulator and may also include a light source. Therefore, in this example, an electrical signal may be received by the optically active component which is converted into a modulated optical signal and provided to the optical fiber for transmission.

On an exposed face of the interposer, which is generally the face which will be closest to any separate die/substrate/printed circuit board to which the interposer is connected, there are disposed one or more electrical interconnects 105, in this example solder bumps. This can allow for the connection to electrical contacts on a printed circuit board or integrated circuit or substrate. The solder bumps are located on an upper 106a under-bump metallization layer, which is in turn above a lower 106b under-bump metallization layer. The upper layer can help ensure good adhesion of the solder bump to the silicon interposer, whilst the lower layer can help ensure that solder or components of the upper layer do not diffuse further into the interposer. In an alternative example, the electrical interconnects are provided as one or more copper pillars which provide a pin grid array.

Junctions 107 are typically capture pads for a copper via or copper pillar, which facilitate the electrical connection from the optically active component 104 to each electrical interconnect 105. Above each junction is a first passivation layer 108, and above the first passivation layer 108 is a second passivation layer 109. These passivation layers: (i) allow the provision of a metal redistribution layer (RLD) 110 to complete the electrical connection from the optically active component(s) to the electrical interconnects; and (ii) passivate the junctions, RDL, and optically active components.

The optical fiber 103 is secured to the interposer 100 through use of a glass cap 111 which is attached to the interposer through a reflow compatible join 112. The reflow compatible joint may be, for example, a solder joint having a higher melting temperature than the solder bumps, or an epoxy also having a higher melting temperature than the solder bumps.

Figure 2:
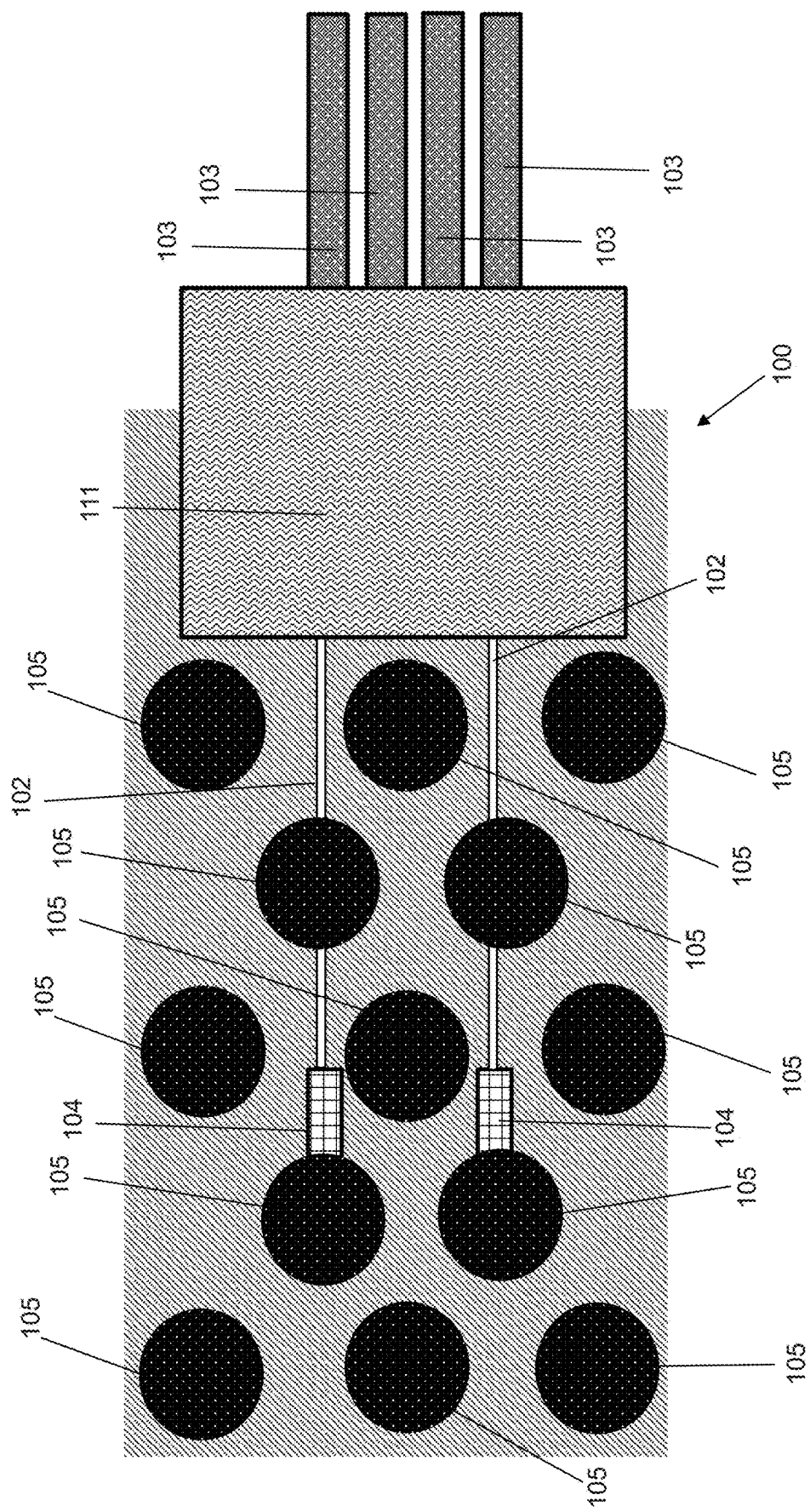
FIG. 2 shows a top down schematic view of the silicon interposer of FIG. 1.

FIG. 2 shows a top down schematic view of the silicon interposer of FIG. 1. Features in common between FIG. 1 and FIG. 2 are indicated by like reference numerals. As can be seen in this image, the interposer contains an array of electrical interconnects 105 (in this example solder bumps), two optically active components 104 each with a respective optical waveguide 102, as well as four optical fibers 103 connecting to the interposer 100. In this example, optical signals received from two of the optical fibers 103 are combined or multiplexed and transmitted down a single optical waveguide 102.

Alternatively, in examples not shown, there may be an optically active component 104 per optical fiber 103. Generally there are at least two electrical interconnects 105 per optically active component. However, there may be more electrical interconnects 105 than strictly necessary to establish an electrical connection between the printed circuit board/substrate/die which the interposer is to be connected to and the optically active components. This is because the electrical interconnects 105 can also function as the means by which the interposer is adhered to the printed circuit board. Therefore, by increasing the number of electrical interconnects, the stability with which the interposer is adhered is increased.

Figure 3:
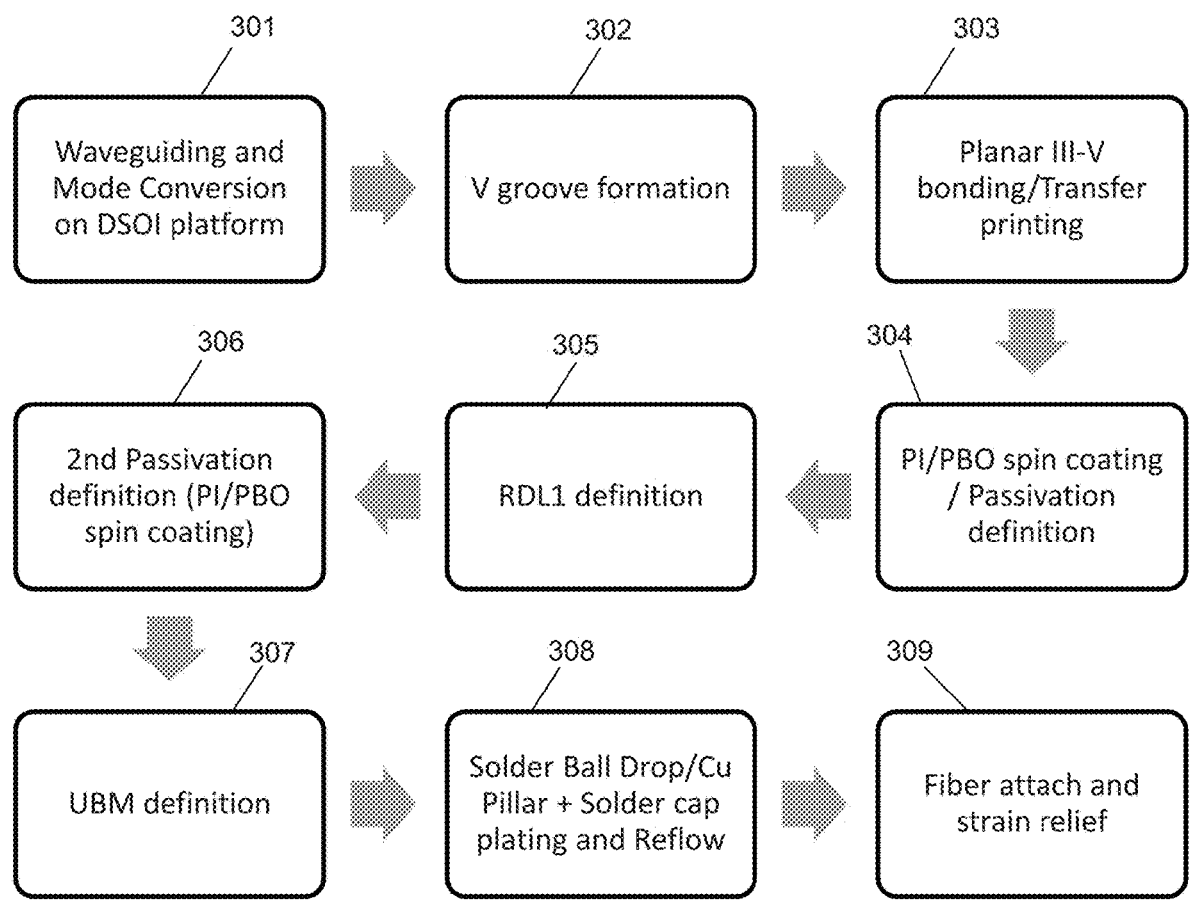
FIG. 3 shows a manufacturing scheme for the silicon interposer of FIGS. 1 and 2.

FIG. 3 shows a manufacturing scheme for the silicon interposer of FIG. 1 and FIG. 2. In a first step 301, wave-guiding and mode conversion functionality are provided on a double-silicon-on-insulator (DSOI) platform. For example, one or more optical waveguides may be fabricated within the DSOI. Mode conversion may be achieved, for example, by provision of a mode converter such as that disclosed in WO 2018/011587 (the entire contents of which is incorporated herein by reference) or by other methods known per se in the art.

In a second step 302, a V-groove interface is formed which is connected to the waveguide(s) formed in step 301. The V-groove interface is usable to connect an optical fiber to each waveguide. In a third step 303, the optically active component is transferred to the DSOI containing the waveguides. The optically active component is, in this example, manufactured on a wafer separate to the DSOI and is then bonded or transfer printed onto the DSOI.

After the optically active component has been provided in the DSOI of the interposer, the fourth step 304 is performed in which polyimide (PI) or photodefinable polybenzoxazole (PBO) is spin coated to define the first passivation layer. After the first passivation layer is provided, the metal redistribution layer 110 is provided in step 305. The metal redistribution layer can be provided, for example, through sputtering of an appropriate metal (e.g. Al, Cu, Ti). The sputtering may be used to provide a seed layer, and a redistribution layer may then be provided through electroplating. After the electroplating, the seed layer may be removed (for example, by a wet etch).

After the metal redistribution layer 110 is provided, the second passivation layer is spin coated in step 306. The second passivation layer, as with the first, can be formed of polyimide (PI) or photodefinable polybenzoxazole (PBO). The second passivation layer may be formed of a material which is the same as the first passivation layer, or may be formed of a material which is different to the material used to form the first passivation layer.

Next, in step 307, the upper and lower under-bump metallization layers 106a and 106b are defined and provided. In examples where the electrical interconnects are provided as copper pillars, this step may be performed after the copper pillars are provided (such that the UBM is plated on top of the copper pillars, prior to a solder cap plating process). In step 308, the electrical interconnects are provided. This can be achieved, for example, by a solder ball drop process or provision of copper pillars followed by solder cap plating and a reflow process on existing Al/Cu pads after the under-bump metallization (when performed). The solder cap would be placed on top of the copper pillars, which would have a Ni or Au layer plated prior to solder plating. The resulting structure may have the following composition: the $2^{nd}$ metal redistribution layer; a 25 μm Cu pillar; a 2 μm Ni layer, a 0.3 μm Au layer, and a 25 μm SAC305 solder plating layer.

After the electrical interconnects have been provided, the optical fiber(s) are attached in step 309 and a strain relief process can be performed. The optical fibers may be secured via attachment of a glass cap and through use of a reflow compatible joint e.g. solder joint or high temperature epoxy.

Steps 301-309 define the manufacture of a silicon interposer as shown in FIGS. 1 and 2. To attach the silicon interposer to a printed circuit board, the solder bumps or copper pillars are aligned with corresponding capture pads on a substrate/printed circuit board. A reflow process is then performed, to either melt the solder bumps on the interposer or melt corresponding solder contacts on the copper pillars and make the connection to other substrates/printed circuit board. Cooling the interposer causes the solder balls or solder contacts to solidify, establishing the electrical and mechanical connection between the interposer and the substrate/die/printed circuit board.

The interposer and/or substrate/die can then be encapsulated in packaging in a manner known per se in the art.

Figure 4A:
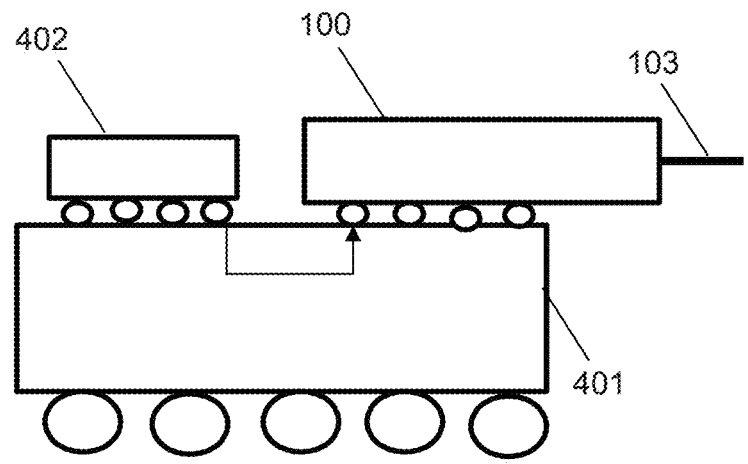
FIG. 4a shows a silicon interposer surface mounted to a high density multichip substrate.

For example, as shown in FIG. 4a, the interposer 100 can be surface mounted to a high density multichip substrate or printed circuit board 401 (for example an organic/glass interposer or flip chip ball grid array, fcBGA). This can allow the interposer to communicate with a further, electronic, component 402 e.g. an application specific integrated circuit.

Figure 4B:
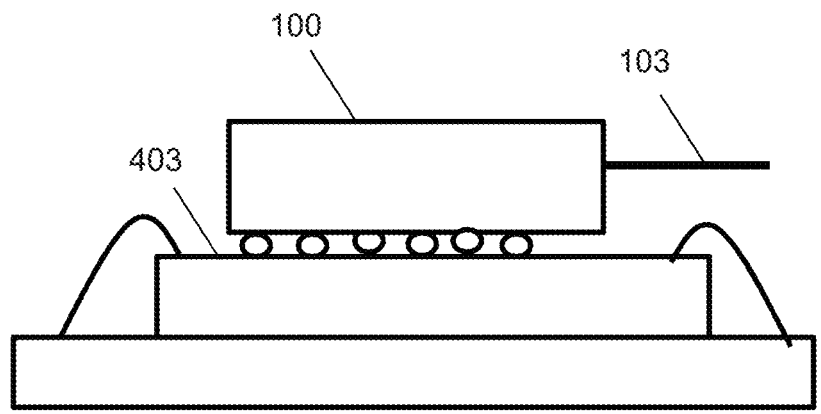
FIG. 4b shows a silicon interposer used in a 3D stacking manner with a printed circuit board.

A further example is shown in FIG. 4b, where interposer 100 with fiber 103 is 3D stacked with an analogue/digital integrated circuit/system on a chip (SOC)/graphics processing unit (GPU) 403.

Figure 4C:
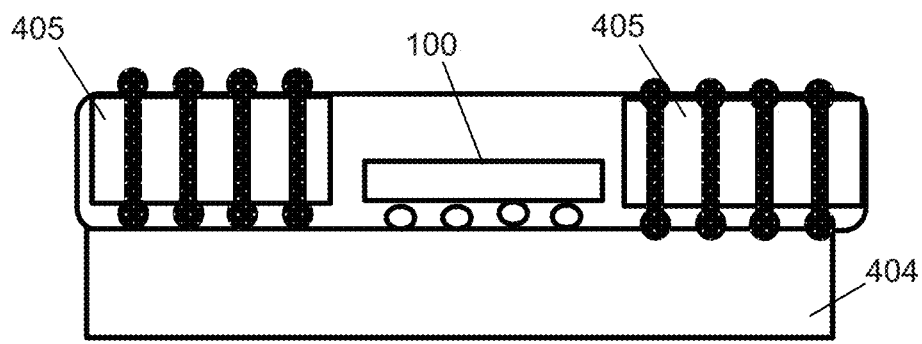
FIG. 4c shows a silicon interposer which is monolithically integrated with a printed circuit board.

A further example is shown in FIG. 4c, where interposer 100 is monolithically integrated with a unit containing silicon interposers 405 with through-silicon vias, all of which are connected to a GPU/SOC 404. This allows co-packing of the silicon interposer on a fan-out wafer-level packaging (FOWLP) platform. This can be directly 3D stacked on the GPU/SOC 404 to achieve significant performance (Monolithic type) benefits.

While the invention has been described in conjunction with the exemplary embodiments described above, many equivalent modifications and variations will be apparent to those skilled in the art when given this disclosure. Accordingly, the exemplary embodiments of the invention set forth above are considered to be illustrative and not limiting. Various changes to the described embodiments may be made without departing from the spirit and scope of the invention.

All references referred to above are hereby incorporated by reference.

LIST OF FEATURES

100 Interposer
101 Silicon layer
102 Optical waveguide
103 Optical fiber
104 Optically active component
105 Solder bump
106a,b Under-bump metallization
107 Doped contact
108 $1^{st}$ Passivation layer
109 Second passivation layer
110 Metal redistribution layer 111 Glass cap
112 Solder joint/high temperature epoxy

The invention claimed is:

1. A silicon interposer, including:
a silicon layer, including an optical waveguide connectable to an optical fiber;
an optically active component, configured to convert optical signals received from the optical fiber into electrical signals or to convert electrical signals into optical signals and provide them to the optical fiber; and
one or more electrical interconnects, connected to the optically active component and connectable to a printed circuit board, a separate die, a separate substrate, or a wafer level package,
wherein the silicon interposer includes a metal redistribution layer, which forms a part of an electrical connection between the optically active component and the one or more electrical interconnects.

2. The silicon interposer of claim 1, wherein the optically active component is a III-V semiconductor based optically active component.

3. The silicon interposer of claim 1, wherein the optically active component includes a photodiode, configured to convert optical signals received from the optical fiber into electrical signals which are provided to the one or more electrical interconnects.

4. The silicon interposer of claim 1, wherein the optically active component includes a light source and a modulator, configured to convert an electrical signal received from a first electrical interconnect of the one or more electrical interconnects to an optical signal providable to the optical fiber.

5. The silicon interposer of claim 1, wherein the one or more electrical interconnects include one or more solder bumps or copper pillars with solder caps.

6. The silicon interposer of claim 1, wherein the one or more electrical interconnects include one or more pins in a pin grid array.

7. The silicon interposer of claim 1, wherein the silicon interposer includes one or more passivation layers located between the optical waveguide and the one or more electrical interconnects.

8. The silicon interposer of claim 1, wherein the silicon interposer includes a mode converter located between the optical fiber and the optical waveguide.

9. A silicon interposer, including:
a silicon layer, including an optical waveguide connectable to an optical fiber;
an optically active component, configured to convert optical signals received from the optical fiber into electrical signals or to convert electrical signals into optical signals and provide them to the optical fiber; and
one or more electrical interconnects, connected to the optically active component and connectable to a printed circuit board, a separate die, a separate substrate, or a wafer level package,
wherein the optical fiber is attached to the optical waveguide using a reflow compatible joint.

10. The silicon interposer of claim 9, wherein the optical fiber is secured to the optical waveguide using a cap.

11. A silicon interposer, including:
a silicon layer, including an optical waveguide connectable to an optical fiber;
an optically active component, configured to convert optical signals received from the optical fiber into electrical signals or to convert electrical signals into optical signals and provide them to the optical fiber; and
one or more electrical interconnects, connected to the optically active component and connectable to a printed circuit board, a separate die, a separate substrate, or a wafer level package,
wherein the silicon interposer is provided as a double-silicon-on-insulator wafer (DSOI wafer), the optical waveguide being formed in a silicon layer of the DSOI wafer.

12. The silicon interposer of claim 11, wherein the optically active component is provided on the same silicon layer of the DSOI wafer as the one or more optical waveguide.

13. A method of manufacturing a silicon interposer, including the steps of:
providing a double silicon-on-insulator wafer (DSOI wafer) in which an optical waveguide is fabricated;
forming an interface at each of the optical waveguide suitable for connection to an optical fiber;
providing an optically active component, configured to convert optical signals received from the optical fiber into electrical signals or to convert electrical signals into optical signals and provide them to the optical fiber; and
providing one or more electrical interconnects connected to the optically active component and connectable to a printed circuit board, a separate die, a separate substrate, or a wafer level package.

14. The method of claim 13, wherein forming the interface includes forming one or more V-groove interfaces for connection to the optical fiber.

15. The method of claim 13, wherein providing the optically active component includes providing a wafer including the optically active component, and bonding or transfer printing the optically active component onto the DSOI wafer.

16. The method of claim 13, including a step, between providing the optically active component and the one or more electrical interconnects, of providing a passivation layer.

17. The method of claim 13, including a step, between providing the optically active component and the one or more electrical interconnects, of providing a metal redistribution layer which forms a part of an electrical connection between the optically active component and the one or more electrical interconnects.

18. The method of claim 17, including a step, after providing the metal redistribution layer, of providing a second passivation layer.

19. The method of claim 13, including a step, after providing the optically active component, of defining one or more under-bump metallization regions, suitable for use with the one or more electrical interconnects.

20. The method of claim 13, wherein the one or more electrical interconnects are provided through a solder ball drop process, a copper pillar bumping process, or through solder printing.

21. The method of claim 13, wherein the one or more electrical interconnects are provided through attachment of one or more pins of a pin grid array to the silicon interposer.

22. The method of claim 13, including a step of attaching an optical fiber to the interface, and securing it in place.

23. The method of claim 22, wherein securing the optical fiber is performed by providing a reflow compatible joint between a cap and the optical fiber.

* * * * *